United States Patent
Hsieh et al.

(10) Patent No.: US 9,391,000 B2
(45) Date of Patent: Jul. 12, 2016

(54) METHODS FOR FORMING SILICON-BASED HERMETIC THERMAL SOLUTIONS

(75) Inventors: Cheng-Chieh Hsieh, Yongkang District (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 347 days.

(21) Appl. No.: 13/445,734

(22) Filed: Apr. 12, 2012

(65) Prior Publication Data

US 2013/0270690 A1    Oct. 17, 2013

Related U.S. Application Data

(63) Continuation-in-part of application No. 13/444,662, filed on Apr. 11, 2012, now Pat. No. 9,034,695.

(51) Int. Cl.
*H01L 23/473* (2006.01)
*H01L 21/48* (2006.01)

(52) U.S. Cl.
CPC .......... *H01L 23/473* (2013.01); *H01L 21/4882* (2013.01); *H01L 2924/0002* (2013.01)

(58) Field of Classification Search
CPC .............. H01L 2224/16; H01L 23/473; H01L 2924/01079; H01L 2924/15311; H01L 2224/73253
USPC ........................................................ 257/713
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 5,990,552 A | 11/1999 | Xie et al. | |
| 6,002,177 A | 12/1999 | Gaynes et al. | |
| 6,031,286 A * | 2/2000 | Levine et al. | 257/714 |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,242,778 B1 * | 6/2001 | Marmillion et al. | 257/347 |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |

(Continued)

FOREIGN PATENT DOCUMENTS

| | | |
|---|---|---|
| TW | I320227 | 4/2009 |
| TW | I313505 | 8/2009 |
| TW | I322821 | 4/2010 |

OTHER PUBLICATIONS

Gaikwad, V. P. "Microchannel Heat Sink Fabrication Technique." IOSR Journal of Mechanical and Civil Engineering (2009): 51-57.*

(Continued)

*Primary Examiner* — Jarrett Stark
*Assistant Examiner* — Charles N Ausar-El
(74) *Attorney, Agent, or Firm* — Slater Matsil, LLP

(57) ABSTRACT

A method includes forming a first oxide layer on a surface of an integrated heat spreader, and forming a second oxide layer on top surfaces of fins, wherein the fins are parts of a heat sink. The integrated heat spreader is bonded to the heat sink through the bonding of the first oxide layer to the second oxide layer.

20 Claims, 10 Drawing Sheets

(56) References Cited

U.S. PATENT DOCUMENTS

| | | |
|---|---|---|
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,583,044 B2* | 6/2003 | Bahl et al. .................. 438/619 |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,183,132 B2 | 2/2007 | Nakamura |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 7,964,951 B2* | 6/2011 | Refai-Ahmed ................ 257/686 |
| 8,314,483 B2* | 11/2012 | Lin et al. ....................... 257/686 |
| 8,564,955 B2* | 10/2013 | Schmidt ................ H01L 23/267 |
| | | 165/104.33 |
| 2005/0136640 A1 | 6/2005 | Hu et al. |
| 2005/0277280 A1* | 12/2005 | Brunschwiler et al. ........ 438/616 |
| 2006/0022330 A1* | 2/2006 | Mallari .......................... 257/717 |
| 2007/0086168 A1* | 4/2007 | Khanna et al. ................ 361/719 |
| 2007/0108595 A1* | 5/2007 | Refai-Ahmed ................ 257/706 |
| 2007/0258213 A1* | 11/2007 | Chen et al. .................... 361/701 |
| 2009/0283902 A1* | 11/2009 | Bezama et al. ................ 257/713 |
| 2010/0117201 A1* | 5/2010 | Ching et al. ................... 257/621 |
| 2010/0127390 A1* | 5/2010 | Barth ............................. 257/714 |
| 2010/0230805 A1* | 9/2010 | Refai-Ahmed ................ 257/712 |

OTHER PUBLICATIONS

Chou et al, "Lithographically induced self-construction of polymer microstructures for resistless patterning," Applied Physics Letters, vol. 75, No. 7, Aug. 16, 1999, 1004-1006.*

Liam E. Renaghan, "On-Chip Isotropic Microchannels for Cooling Three Dimensional Microprocessors", Thesis submitted to the faculty of the Virginia Polytechnic Institute and State University in partial fulfillment of the requirements for the degree of Master of Science in Mechanical Engineering, Dec. 4, 2009, Blacksburg, Virginia, copyright 2009.*

"ST19 Specification & Thermal Data," Alpha Next Generation Heat Sinks, Online Catalog-ST-ST19, http://www.alphanovatech.com/c_st19e.html, printed Feb. 14, 2011, 2 pages.

"Moderately Configured Aluminum Pin Fin Heath Sinks," Coolinnovations Advanced Heat Sinks, www.coolinnovations.com; printed Feb. 11, 2014, 1 page.

* cited by examiner

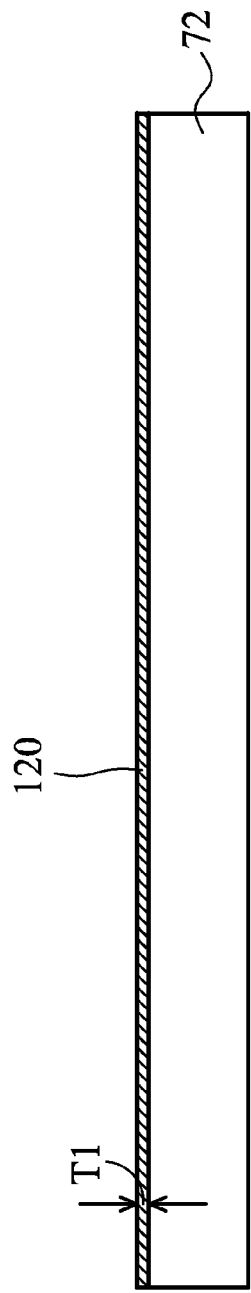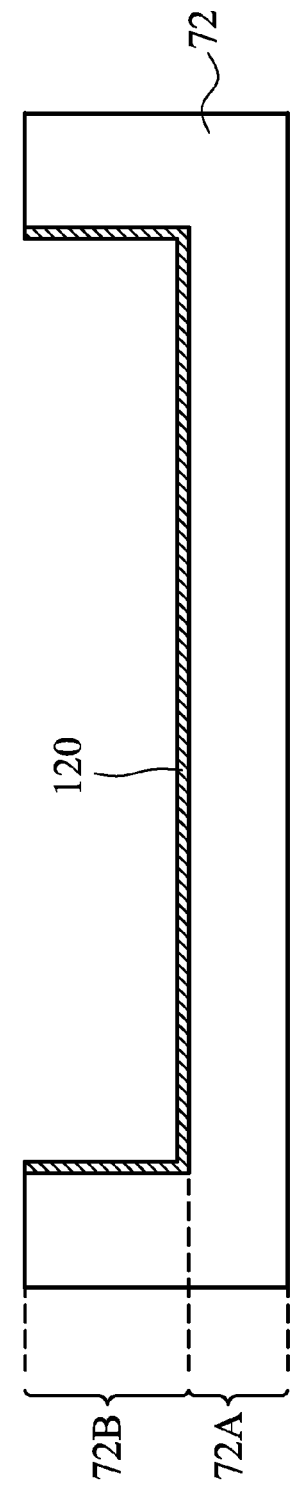

… (1) …

METHODS FOR FORMING SILICON-BASED HERMETIC THERMAL SOLUTIONS

This application is a Continuation-In-Part of, and claims the priority of, the following co-pending U.S. patent application Ser. No. 13/444,662, filed Apr. 11, 2012, and entitled "Integrated Thermal Solutions for Packaging Integrated Circuits," which application is hereby incorporated herein by reference.

BACKGROUND

Integrated circuits are formed on semiconductor wafers. The wafers are sawed into dies, which are packaged before being used. The recent trend shows that the thickness of the wafers became increasing thinner. With thinner wafers, three Dimensional Integrated Circuit (3DIC) formation processes can be accommodated.

The thinned wafers resulted in the difficulty in the integrated circuit manufacturing processes. An example is that the thin wafers have significant warpage, and some of the processes may not be able to be performed on the warped wafers. To solve this problem, when thin wafers are handled or wafers are thinned, carriers are bonded to the thin wafers. The carriers are thick enough, and do not suffer from the warpage problem. Through adhesives, thin wafers that are adhered on carriers may remain planar.

The warpage of the thin wafers, however, is rejuvenated whenever the thinner wafers are demounted from the carriers. To solve this problem, the thin wafers may be diced into dies along with the carriers. Since the dies have small sizes, the warpage problem in the resulting dies is not significant. A problem in this solution is that the carriers are also diced, and hence cannot be reused.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 5 are cross-sectional views of intermediate stages in the manufacturing of a package including a heat sink in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Package including heat sinks and the methods of bonding the heat sink are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1A and 1B illustrate the formation of oxide layer 120 on integrated heat spreader 72. In some embodiments, integrated heat spreader 72 is formed of a thermal conductive material comprising silicon, a metal, or the like. When formed of metal, integrated heat spreader 72 may be formed of metals such as aluminum, copper, or alloys thereof. Integrated heat spreader 72 may be planar, as shown in FIG. 1A, or may have other shapes. For example, FIG. 1B illustrates that integrated heat spreader 72 has a shape of a cap, which includes planar portion 72A and edge portions 72B connected to top portion 72A. The edge portions may have a top-view shape of a ring. In the following illustrated exemplary embodiments, although integrated heat spreader 72 is illustrated as planar, the teaching of the embodiments may be applied to integrated heat spreaders having other shapes.

Oxide layer 120 may comprise silicon oxide, for example. The formation may be performed through a deposition method such as Plasma Enhanced Vapor Deposition (PECVD), Low-Pressure Chemical Vapor Deposition (LPCVD), High Density Plasma (HDP), furnace for wet deposition, or the like. Thickness T1 of oxide layer 120 may be between about 1 kÅ and about 20 kÅ, for example. It is appreciated, however, that the dimensions recited throughout the description are merely examples, and may be changed to different values. In the embodiments wherein integrated heat spreader 72 is formed of silicon, the formation of oxide layer 120 may also include a thermal oxidation of silicon. In these embodiments, after the thermal oxidation, a patterning may be performed to remove portions of oxide layer 120 from some portions of the surfaces of integrated heat spreader 72, as shown in FIGS. 1A and 1B. Alternatively, after the thermal oxidation, no patterning is performed.

Figure 2:
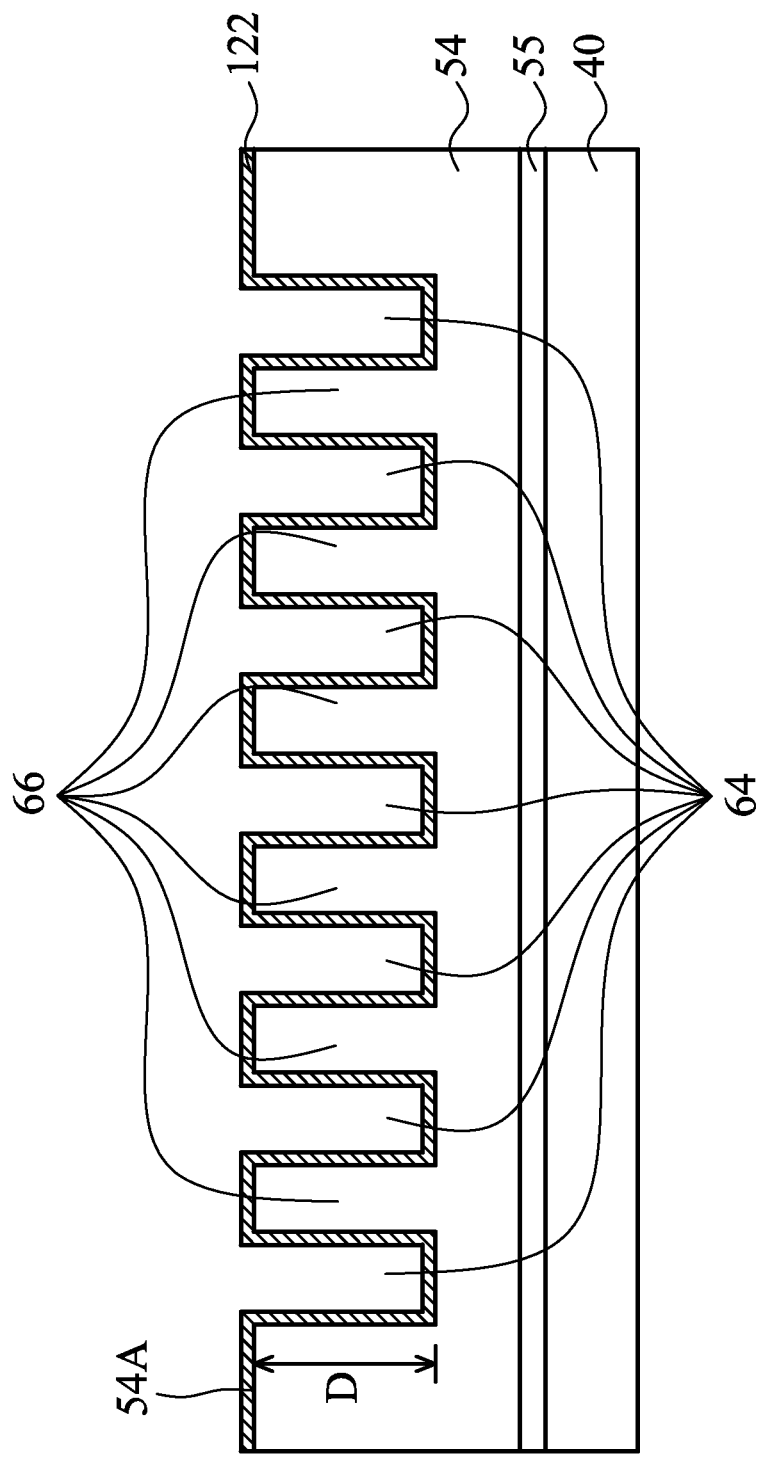

FIG. 2 illustrate the formation of oxide layer 122 on heat sink 54. Oxide layer 122 may comprise silicon oxide, for example. The oxide of oxide layer 120 and oxide layer 122 may be the same, or may be different from each other. The formation may be performed through a deposition method such as PECVD, LPCVD, HDP, furnace for wet deposition, or the like.

Heat sink 54 is further attached to die 40 through adhesive layer 55. Heat sink 54 may include silicon, glass, ceramic, or the like. The silicon in heat sink may be crystalline silicon. Furthermore heat sink 54 may be formed of homogeneous silicon. The thermal conductivity of heat sink 54 may be greater than about 100 Watts/m*K, or greater than about 150 Watts/m*K. Adhesive layer 55 may comprise a thermal conductive adhesive, which may be a Die Attach Film (DAF), a thermal epoxy glue, an adhesive Thermal Interface Material (TIM), or the like. Die 40 may be a device die comprising active circuits therein, wherein the active circuits may include transistors, for example. The materials and formation methods of die 40, adhesive layer 55, and heat sink 54 may be essentially the same as the like components, which are denoted by like reference numerals in the embodiments shown in FIGS. 1 through 5B of co-pending U.S. patent application Ser. No. 13/444,662, filed Apr. 11, 2012, and entitled "Integrated Thermal Solutions for Packaging Integrated Circuits," which application is hereby incorporated herein by reference. In these embodiments, heat sink 54 is a carrier-converted heat sink, which is converted from a carrier that is used for forming the wafer that comprises die 40 therein. Accordingly, heat sink 54 may have a top-view size same as the top-view size of die 40, and the edges of heat sink 54 may be aligned to the respective edges of die 40.

In alternative embodiments, heat sink 54 is attached to die 40 after the formation of the wafer that comprises die 40 is finished, and die 40 is sawed from the respective wafer. In which embodiments, heat sink 54 may not necessarily be converted from the carrier that is used in the formation of die 40. Accordingly, heat sink 54 may have a top-view size the same as, or different from, the top-view size of die 40, and the edges of heat sink 54 may be, or may not be, aligned to the respective edges of die 40.

In some embodiments, heat sink 54 includes trenches 64, and fins 66 between trenches 64. Fins 66 may also form an array, for may form a plurality of parallel fins. In a top view of heat sink 54 (please refer to FIGS. 9 and 10), trenches 64 may include a first plurality of trenches 64A parallel to each other. Trenches 64 may (or may not) include a second plurality of trenches 64B parallel to each other, wherein the second plurality of trenches 64B is perpendicular to the first plurality of trenches 64A. As shown in FIG. 2, trenches 64 extend from top surface 54A to an intermediate level of heat sink 54. In some embodiments, depth D1 (which is also the fin height of fins 66) of trenches 64 may be between about 200 μm and about 800 μm.

Figure 3:
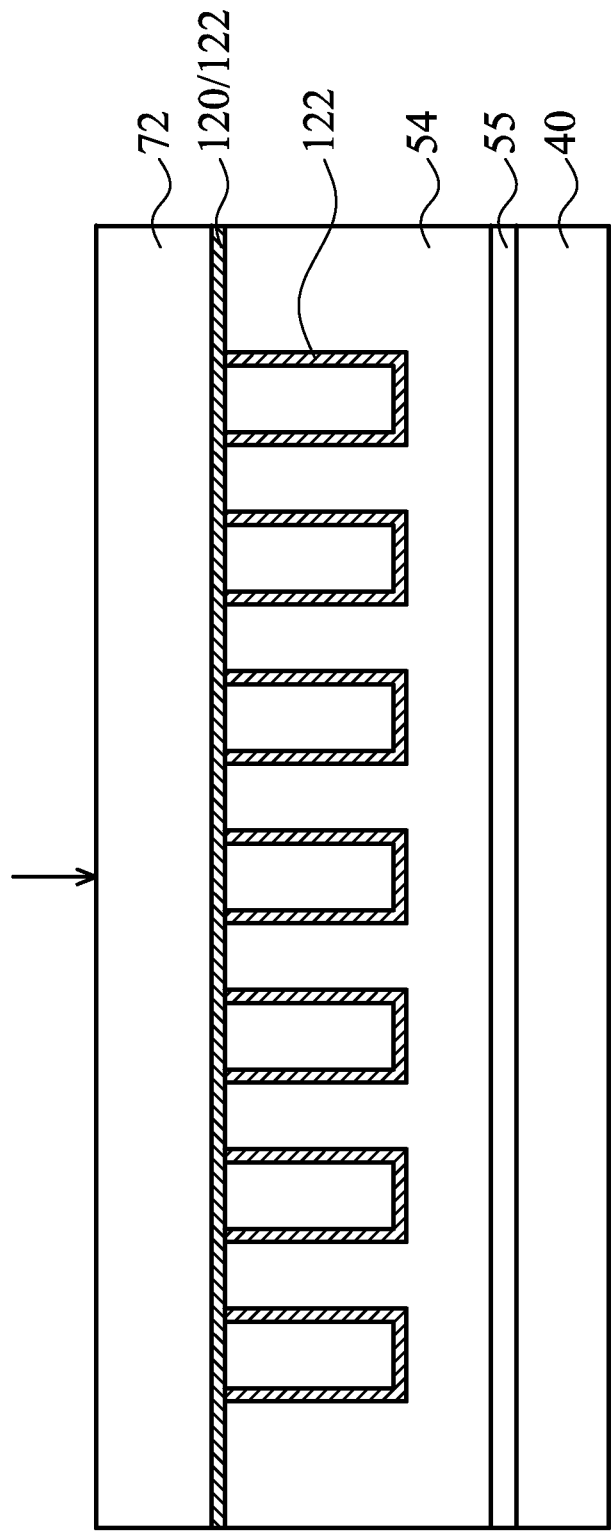

FIG. 3 illustrates the bonding of heat sink 54 to integrated heat spreader 72, wherein oxide layer 120 is bonded to oxide layer 122. The bonding of oxide layers 120 and 122 may be an oxide-to-oxide bonding. In some exemplary embodiments, in the bonding process, a process gas comprising $SiH_4$ or $N_2O$ (for example, for PECVD), Tetra Ethyl Oxysilane (TEOS) or $O_2$ (for example, for LPCVD), $SiH_4$ or $O_2$ (for example, for HDP), $H_2$ or $O_2$ (for example, for furnace for wet deposition), and the like may be introduced. Furthermore, in the bonding process, heat sink 54 and integrated heat spreader 72 may be heated to a temperature that is higher than the room temperature (for example, 21° C.), and lower than about 200° C. The temperature is low enough to ensure that the structures and devices in die 40 are not damaged. A pressure may also be applied to press heat sink 54 and integrated heat spreader 72 against each other during the bonding process. After the bonding, integrated heat spreader 72 tightly seals trenches 64 in heat sink 54, and trenches 64 are interconnected to form a hermetic chamber that includes a plurality of micro-channels.

Figure 4:
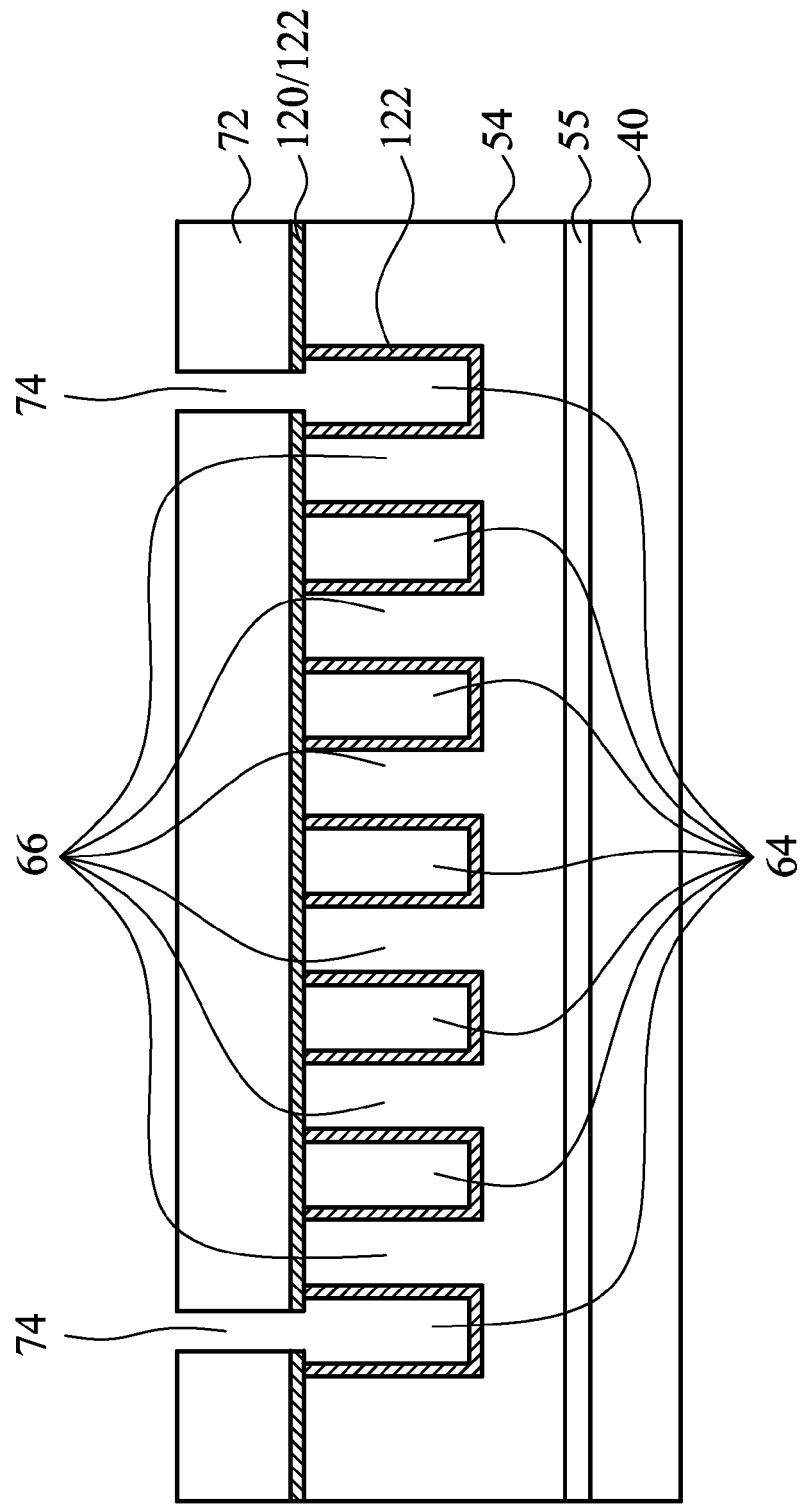
Figure 5:
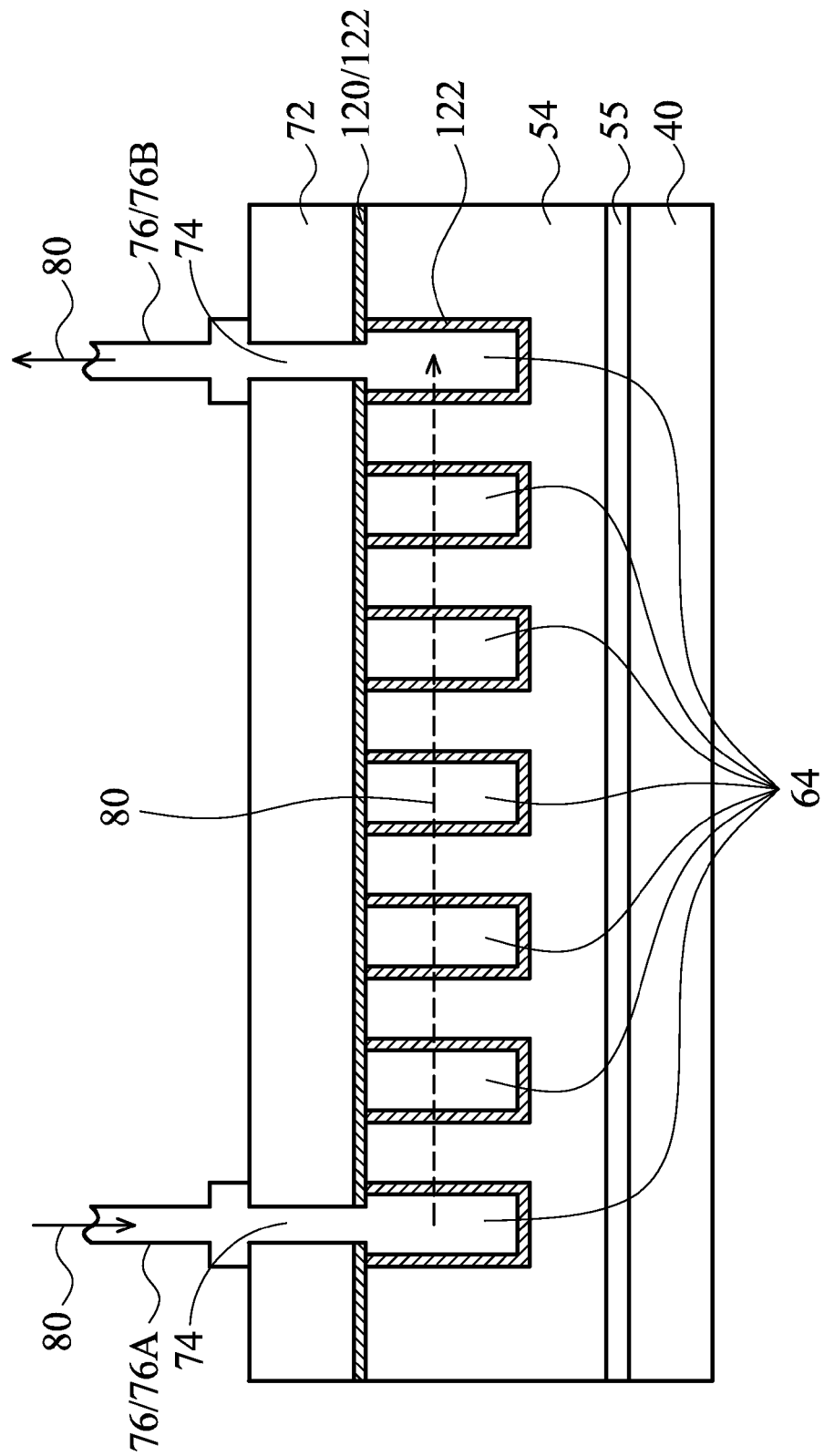

Referring to FIG. 4, in some embodiments, after the bonding of heat sink 54 to integrated heat spreader 72, holes 74 may be formed in integrated heat spreader 72 to connect to trenches 64. Holes 74 may also be pre-formed before integrated heat spreader 72 is bonded to heat sink 54. Holes 74 may be formed using drilling, etching, or the like. As shown in FIG. 5, pipes 76 may be installed on integrated heat spreader 72. Pipes 76 may be formed of a metal or a metal alloy. Alternatively, pipe 76 may be formed of plastic, ceramic, or the like. The inner spaces of pipes 76 are connected to trenches 64 through holes 74.

Pipes 76 include two pipes 76A and 76B, which may be used as an inlet pipe and an outlet pipe. In the operation of die 40, heat is generated in die 40, and the heat is conducted to heat sink 54. A cooling media such as water, oil, cold air, or the like may be conducted into trenches 64 through pipes 76, and hence the heat is conducted away by the cooling media. Arrow 80 schematically illustrates the direction of the flow of the cooling media.

Figure 6:
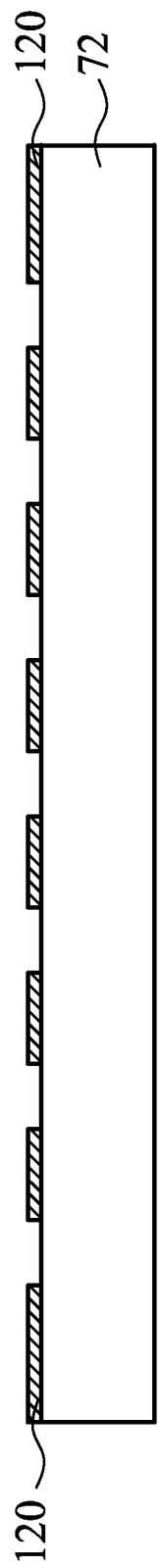
FIGS. 6 through 8 are cross-sectional views of intermediate stages in the manufacturing of a package including a heat sink in accordance with alternative embodiments, wherein oxide layer used for bonding are patterned.
Figure 7:
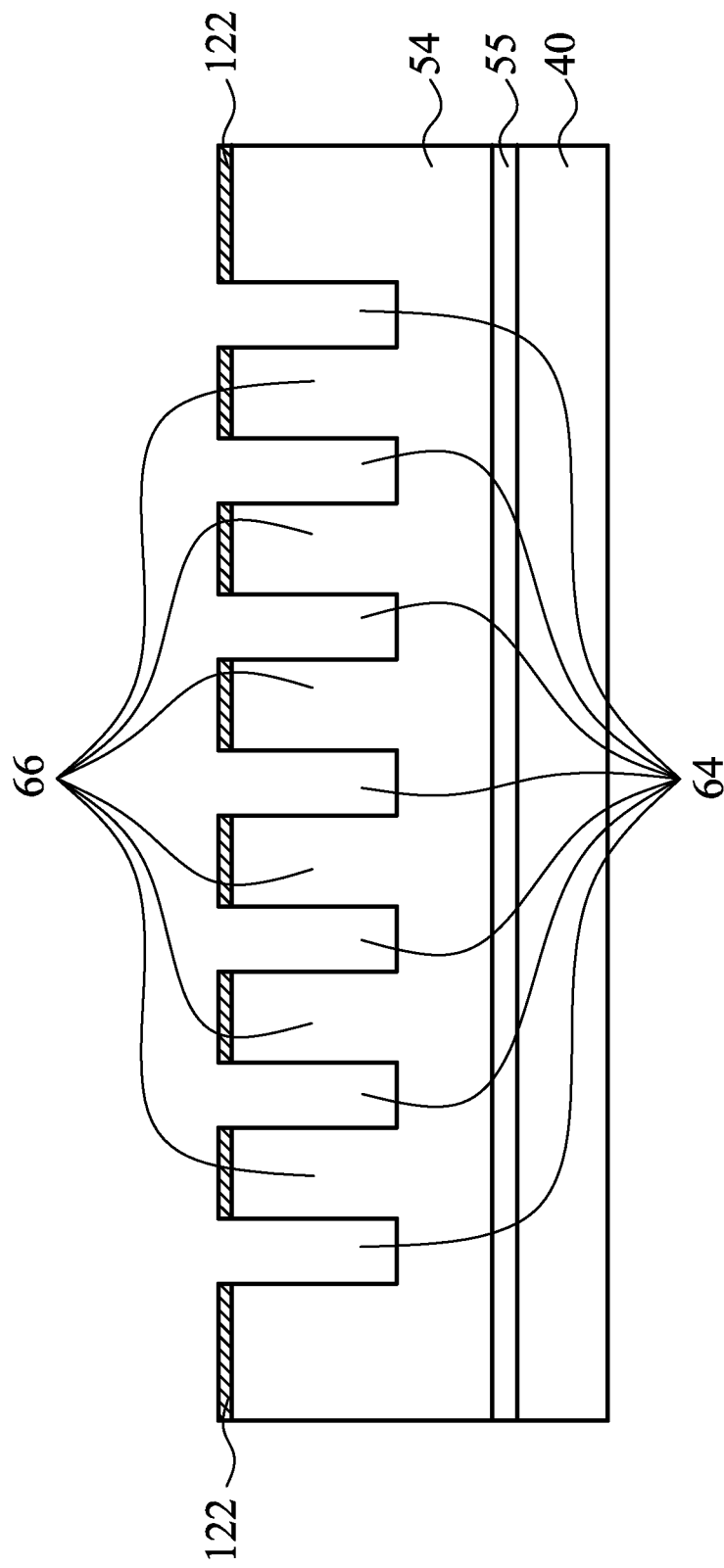
Figure 8:
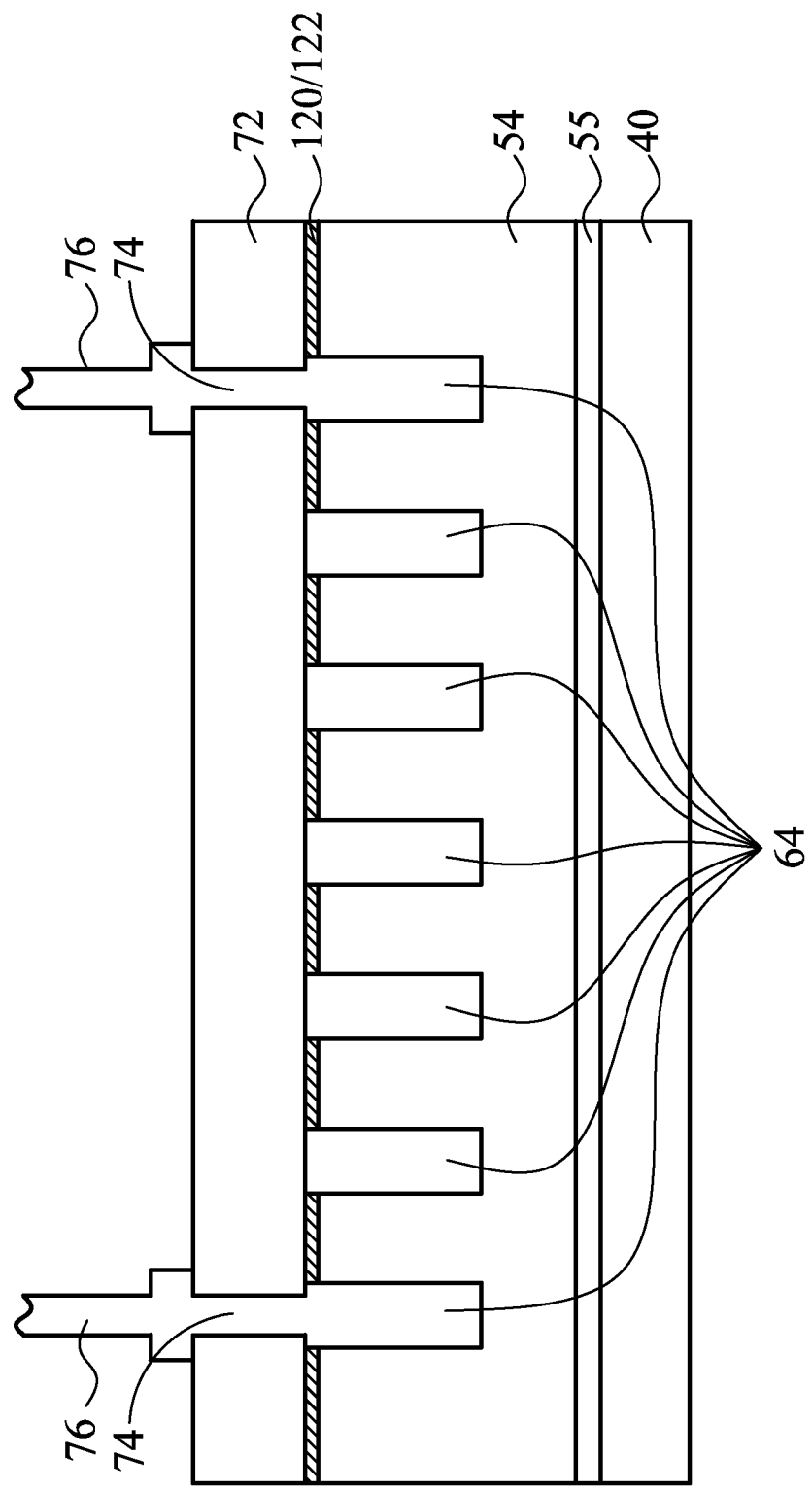

FIG. 6 through 8 illustrate cross-sectional views of intermediate stages in the formation of a package in accordance with alternative embodiments. Unless specified otherwise, the materials and formation methods of the components in these embodiments are essentially the same as the like components, which are denoted by like reference numerals in the embodiments shown in FIGS. 1 through 5. The details of the like components shown in FIGS. 6 through 8 may thus be found in the discussion of the embodiments shown in FIGS. 1 through 5.

Referring to FIG. 6, oxide layer 120 is formed on integrated heat spreader 72, and is then patterned. The patterning may be performed, for example, through a lithography process. Referring to FIG. 7, oxide layer 122 is formed on a surface of heat sink 54. Oxide layer 122 includes portions on the top surfaces of fins 66. Inside trenches 64, oxide layer 122 may or may not exist. The formation of oxide layer 122 may include a non-conformal deposition method. Alternatively, oxide layer 122 may be formed by a conformal or a non-conformal deposition method, and an etching step may be performed to remove the portions of oxide layer 122 inside trenches 64.

Next, as shown in FIG. 8, integrated heat spreader 72 is bonded to heat sink 54 through the bonding of oxide layers 120 and 122. The portions of oxide layer 120 overlap the portions of oxide layer 122 that are on the top surfaces of fins 66. Accordingly, in the patterning of oxide layer 120 (FIG. 6), in locations where oxide layer 120 is to be bonded to oxide layer 122, the respective portions of oxide layers 120 and/or oxide layer 122 are not removed. In other locations, the portions of oxide layers 120 and/or 122 may be removed. As a result, portions of the bottom surface (which may be the surface of a metal) of integrated heat spreader 72 are exposed to trenches 64. In subsequent steps, holes 74 are formed in integrated heat spreader 72 to connect to trenches 64. Pipes 76 are then installed. In these embodiments, since oxide layers 120 and/122 are removed from trenches 64, the cooling media that flows in trenches 64 contacts heat sink 54 and integrated heat spreader 72, and the heat dissipating ability of the resulting package is improved.

Figure 9:
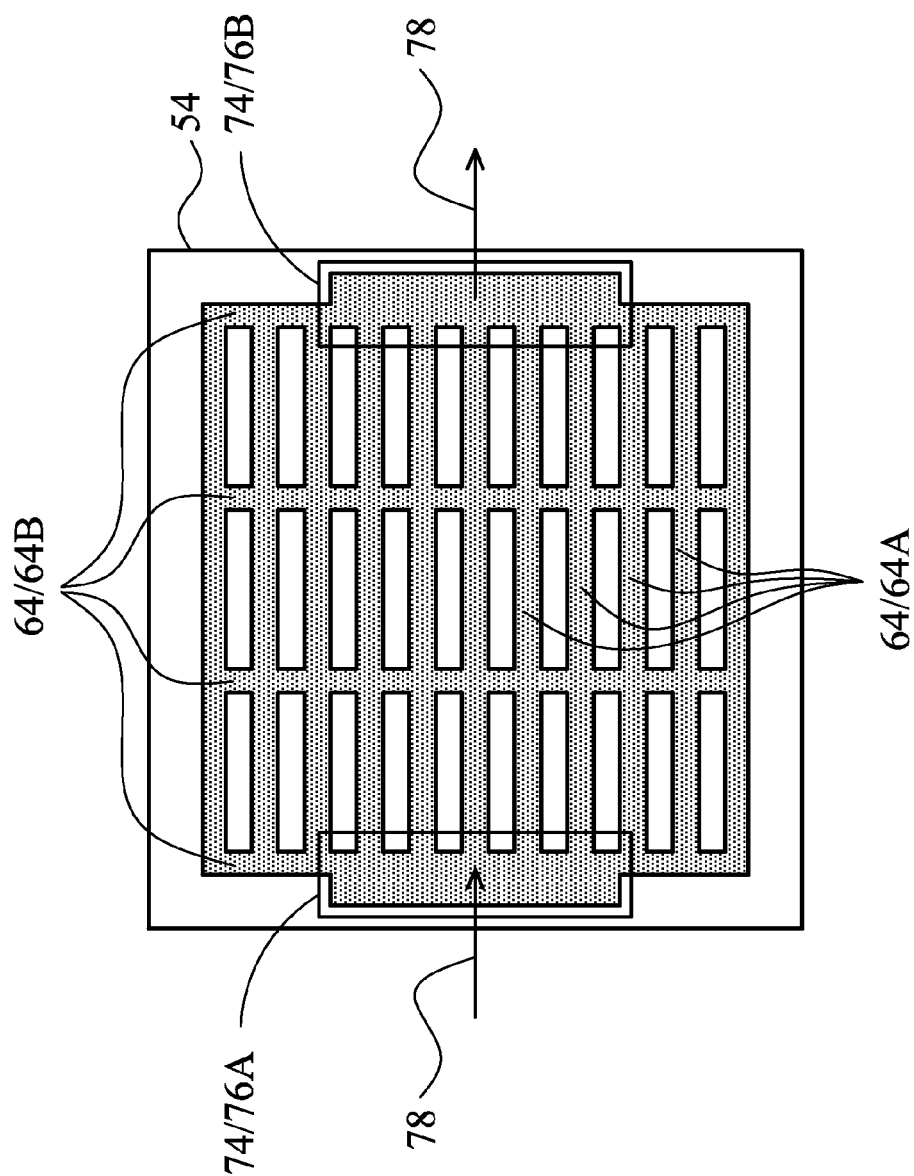
FIGS. 9 and 10 are top views of exemplary packages.
Figure 10:
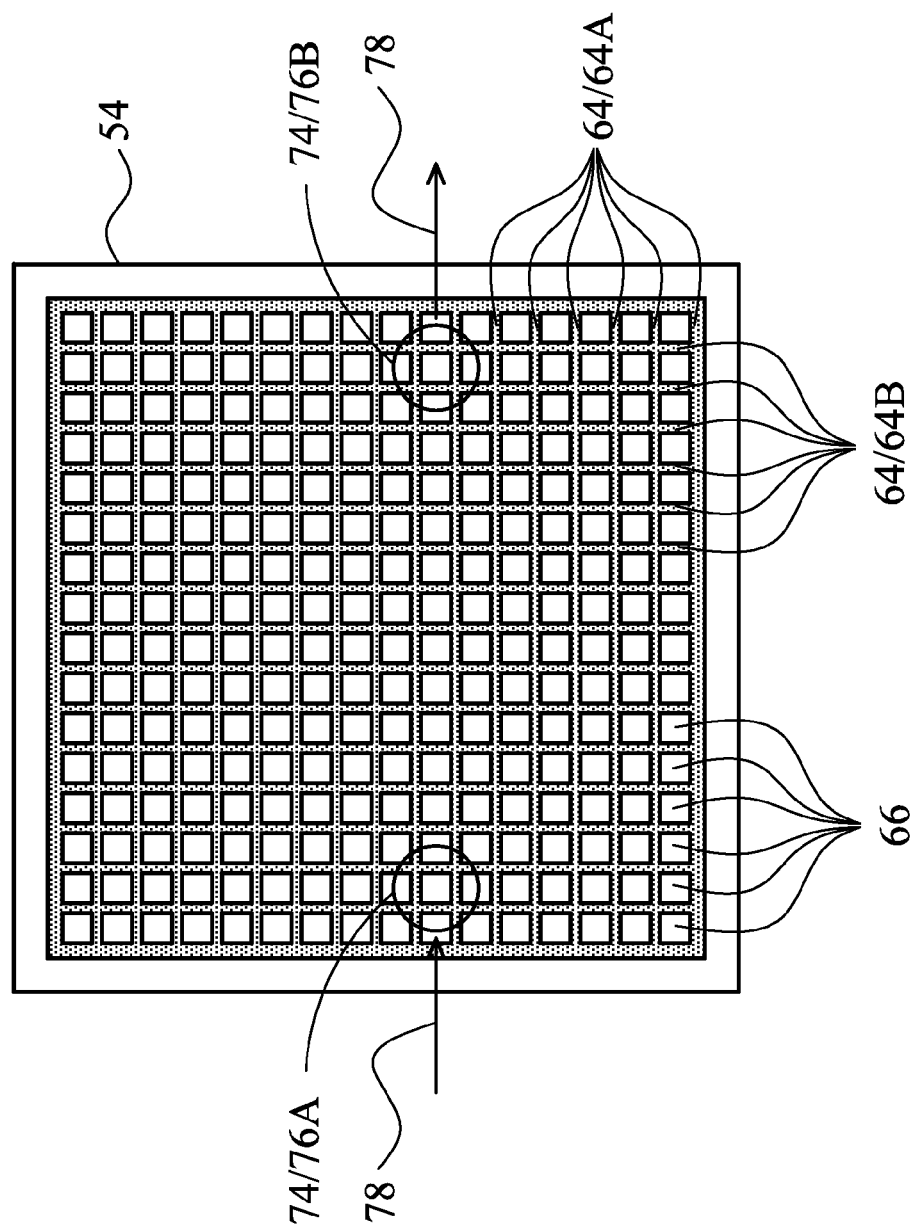

FIGS. 9 and 10 illustrate the top views of the structure shown in FIGS. 5 and 8 in accordance with exemplary embodiments. Referring to FIG. 9, some of trenches 64 (marked as 64A) are parallel to each other, and have lengthwise directions pointing from inlet pipe 76A to outlet pipe 76B. Some of trenches 64 (marked as 64B) may be formed in the direction perpendicular to the lengthwise directions of trenches 64. Trenches 64B interconnect trenches 64A. The spacing between trenches 64B may be greater than trenches 64A in some embodiments.

In FIG. 10, trenches 64B have substantially the same spacing as trenches 64A, and hence trenches 64A and 64B form a grid structure. In these embodiments, inlet and outlet pipes 76 may be placed on opposite sides or ends of heat sink 54. In these embodiments, trenches 64A and 64B may be used as evaporation channels. A fluid (illustrated as arrow 78) that is conducted into inlet pipe 76A may evaporate into vapor by the heat generated in die 40, and the vapor exits out of outlet pipe 76B to bring away the heat.

In accordance with embodiments, a method includes forming a first oxide layer on a surface of an integrated heat spreader, and forming a second oxide layer on top surfaces of fins, wherein the fins are parts of a heat sink. The integrated heat spreader is bonded to the heat sink through the bonding of the first oxide layer to the second oxide layer.

In accordance with other embodiments, a method includes depositing a first oxide layer on a surface of an integrated heat spreader, and depositing a second oxide layer on a heat sink. The heat sink is adhered to a die through an adhesive. The second oxide layer and the die are on opposite sides of the heat sink. The heat sink includes a plurality of fins, wherein the second oxide layer has portions on top surfaces of the plurality of fins. The heat sink further includes a plurality of trenches between the plurality of fins, wherein the plurality of trenches is interconnected. The method further includes bonding the first oxide layer to the second oxide layer through oxide-to-oxide bonding, wherein the integrated heat spreader covers the plurality of trenches.

In accordance with yet other embodiments, a device includes a die, and an adhesive in contact with the die. A heat sink is further in contact with the adhesive, wherein the heat sink includes a plurality of fins, and a plurality of trenches between the plurality of fins. The plurality of trenches is interconnected. The device further includes an integrated heat spreader over the heat sink, and an oxide layer between the integrated heat spreader and the heat sink, wherein the oxide layer contacts top surfaces of the plurality of fins and a bottom surface of the integrated heat spreader.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first oxide layer on a surface of an integrated heat spreader, wherein the forming the first oxide layer comprises:
      forming the first oxide layer as a blanket layer on the surface of the integrated heat spreader; and
      patterning the first oxide layer to expose first portions of the surface, wherein portions of the first oxide layer covering second portions of the surface are removed;
   depositing a second oxide layer on a heat sink, with the heat sink comprising a plurality of trenches and fins between the plurality of trenches;
   patterning the second oxide layer by removing portions of the second oxide layer inside the plurality of trenches; and
   bonding the integrated heat spreader to the heat sink by bonding the first oxide layer to the second oxide layer, wherein after the bonding, the second portions of the surface of the integrated heat spreader are exposed to a plurality of trenches in the heat sink.

2. The method of claim 1 further comprising attaching a die to the heat sink through an adhesive, wherein the adhesive is attached to a bottom surface of the heat sink, with the bottom surface being opposite to top surfaces of the fins.

3. The method of claim 2, wherein the step of forming the second oxide layer is performed after the die is attached to the heat sink.

4. The method of claim 1, wherein the plurality of trenches is interconnected to each other and separated by the fins, wherein the integrated heat spreader seals the plurality of trenches, and wherein the method further comprises forming holes penetrating through the integrated heat spreader and connected to the plurality of trenches in the heat sink.

5. The method of claim 4 further comprising installing pipes on the integrated heat spreader, wherein inner spaces of the pipes are connected to the plurality of trenches.

6. A method comprising:
   forming a first oxide layer on a surface of an integrated heat spreader;
   depositing a second oxide layer on a heat sink, with the heat sink comprising a plurality of trenches and a plurality of fins between the plurality of trenches, wherein the plurality of trenches is interconnected;
   patterning the second oxide layer by removing portions of the second oxide layer inside the plurality of trenches, with portions of the second oxide layer on top surfaces of the plurality of fins left after the patterning; and
   bonding the first oxide layer to the second oxide layer through oxide-to-oxide bonding, wherein the integrated heat spreader covers the plurality of trenches.

7. The method of claim 6 further comprising forming holes in the integrated heat spreader, and wherein the holes are connected to the plurality of trenches.

8. The method of claim 7 further comprising installing pipes on the integrated heat spreader, wherein inner spaces of the pipes are connected to the plurality of trenches through the holes.

9. The method of claim 6, wherein the step of forming the first oxide layer comprises:
   forming the first oxide layer as a blanket layer on the surface of the integrated heat spreader; and
   patterning the first oxide layer, wherein after the step of bonding the integrated heat spreader to the heat sink, portions of the surface of the integrated heat spreader are exposed to the plurality of trenches.

10. The method of claim 6, wherein the step of forming the second oxide layer comprises:
    depositing the second oxide layer on the heat sink; and
    patterning the second oxide layer to expose portions of the heat sink, wherein after the bonding, the portions of the heat sink is exposed to the plurality of trenches.

11. The method of claim 6, wherein the first and the second oxide layers comprise silicon oxide.

12. The method of claim 6, wherein before the step of depositing the second oxide layer on the heat sink, the heat sink is attached to a die, and wherein edges of the die are aligned to respective edges of the heat sink.

13. A method comprising:
    forming a blanket oxide layer on a planar surface of an integrated heat spreader;
    patterning the blanket oxide layer to form a first oxide layer with patterns;
    depositing a second oxide layer on a heat sink, with the heat sink comprising a plurality of trenches and a plurality of fins between the plurality of trenches, wherein the plurality of trenches is interconnected;
    patterning the second oxide layer by removing portions of the second oxide layer inside the plurality of trenches, with portions of the second oxide layer on top surfaces of the plurality of fins left after the patterning; and
    bonding the first oxide layer to the second oxide layer, with portions of the first oxide layer aligned to and bonded to respective portions of the second oxide layer, wherein the integrated heat spreader covers the plurality of trenches, and wherein after the bonding the integrated heat spreader to the heat sink, portions of the planar surface of the integrated heat spreader are exposed to the plurality of trenches.

14. The method of claim 13 further comprising forming two holes in the integrated heat spreader, wherein the two holes are interconnected through the plurality of trenches.

15. The method of claim 14 further comprising installing two pipes, each connected to one of the two holes.

16. The method of claim 13, wherein the forming the second oxide layer comprises:
   depositing the second oxide layer on the heat sink; and
   patterning the second oxide layer to expose portions of the heat sink, wherein after the bonding, surfaces of the heat sink is exposed to the plurality of trenches.

17. The method of claim 13, wherein the first and the second oxide layers are formed of silicon oxide.

18. The method of claim 13, wherein before the depositing the second oxide layer on the heat sink, the heat sink is attached to a die, and wherein edges of the die are aligned to respective edges of the heat sink.

19. The method of claim 13, wherein the integrated heat spreader comprises silicon, and the forming the blanket oxide layer on the planar surface of the integrated heat spreader comprises thermal oxidation.

20. The method of claim 13, wherein the heat sink comprises silicon.

\* \* \* \* \*